(12) United States Patent
McSwiney et al.

(10) Patent No.: US 7,704,858 B2
(45) Date of Patent: Apr. 27, 2010

(54) METHODS OF FORMING NICKEL SILICIDE LAYERS WITH LOW CARBON CONTENT

(75) Inventors: Michael L. McSwiney, Scappoose, OR (US); Matthew V. Metz, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 398 days.

(21) Appl. No.: 11/731,275

(22) Filed: Mar. 29, 2007

(65) Prior Publication Data
US 2008/0242059 A1    Oct. 2, 2008

(51) Int. Cl.
*H01L 21/322* (2006.01)
*H01L 21/44* (2006.01)

(52) U.S. Cl. .............. 438/475; 438/655; 438/664; 438/680; 438/681; 438/682; 257/E21.165; 257/E21.199

(58) Field of Classification Search ............... 438/475, 438/664, 680–682, 655; 257/E21.165, E21.199
See application file for complete search history.

(56) References Cited

U.S. PATENT DOCUMENTS

| 6,720,225 B1 * | 4/2004 | Woo et al. ................. 438/303 |
| 2004/0105934 A1 * | 6/2004 | Chang et al. ............ 427/255.28 |
| 2006/0093848 A1 * | 5/2006 | Senkevich et al. .......... 428/585 |

* cited by examiner

*Primary Examiner*—Matthew C Landau
*Assistant Examiner*—Daniel Luke
(74) *Attorney, Agent, or Firm*—Rahul D. Engineer

(57) ABSTRACT

A method for forming a nickel silicide layer on a MOS device with a low carbon content comprises providing a substrate within an ALD reactor and performing an ALD process cycle to form a nickel layer on the substrate, wherein the ALD process cycle comprises pulsing a nickel precursor into the reactor, purging the reactor after the nickel precursor, pulsing a mixture of hydrogen and silane into the reactor, and purging the reactor after the hydrogen and silane pulse. The ALD process cycle can be repeated until the nickel layer reaches a desired thickness. The silane used in the ALD process functions as a getterer for the advantageous carbon, resulting in a nickel layer that has a low carbon content. The nickel layer may then be annealed to form a nickel silicide layer with a low carbon content.

8 Claims, 4 Drawing Sheets

METHODS OF FORMING NICKEL SILICIDE LAYERS WITH LOW CARBON CONTENT

BACKGROUND

The metal-oxide-semiconductor field-effect transistor (MOSFET) is a common transistor used in the production of integrated circuits. During the fabrication of a MOSFET, silicide layers may be used to improve the conductivity of polysilicon-containing active regions of the MOSFET. For instance, silicide may be formed on the source and drain regions of a MOSFET to improve their conductivity. The silicide layer has better electrical properties than the polysilicon alone.

The process in which silicide is formed is often called salicide (i.e., self-aligned silicide). The process to form salicide begins by depositing a thin transition metal layer, such as a nickel layer, onto the polysilicon-containing active regions of the device. The metal and a portion of the polysilicon are then alloyed together to form the silicide layer. For instance, if nickel is used, the nickel reacts with the polysilicon to form nickel silicide. The alloying process may include a series of annealing and/or etch processes. Following the silicide formation, any remaining transition metal may be removed by chemical etching, leaving silicide layers in only the active regions of the MOSFET.

An atomic layer deposition process may be used to form the thin nickel metal layer. Unfortunately, in conventional processes, the metal layers that are formed have an unacceptably high amount of carbon incorporation. The carbon content is generally greater than 5%. The presence of carbon may increase the resistivity of the silicide layer. Accordingly, there is a need for salicide processes that generate nickel silicide layers with low carbon content.

DETAILED DESCRIPTION

Described herein are systems and methods of forming silicide layers that have low carbon content. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
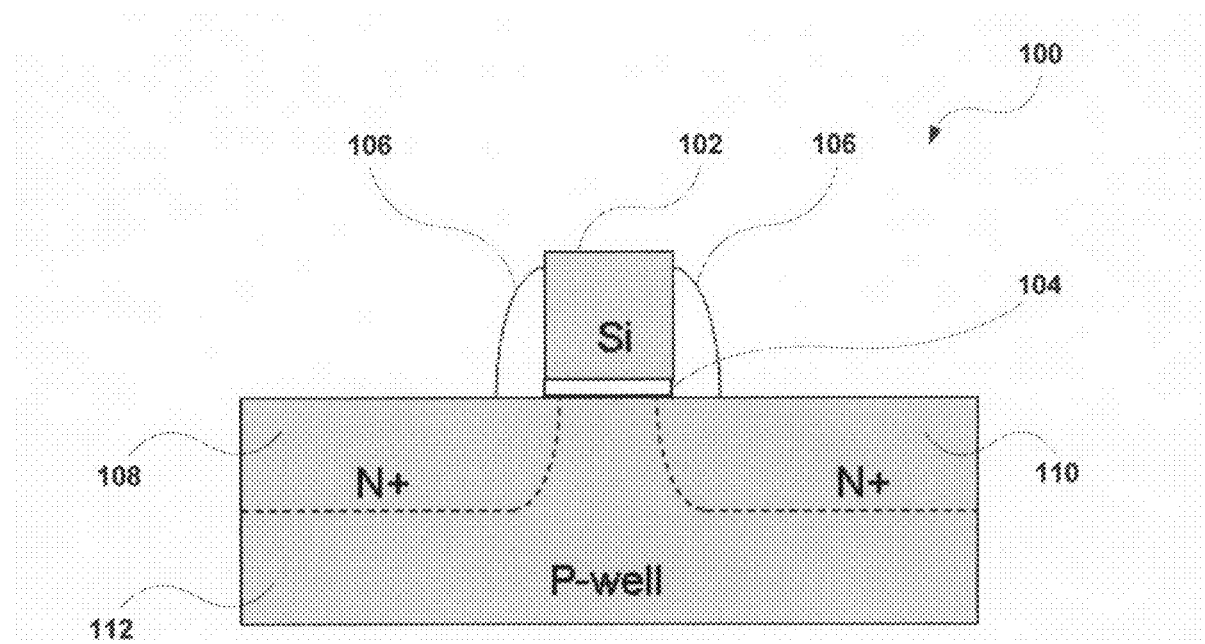
FIGS. 1A to 1C illustrate how a conventional silicide layer is formed on a MOS transistor.
Figure 1B:
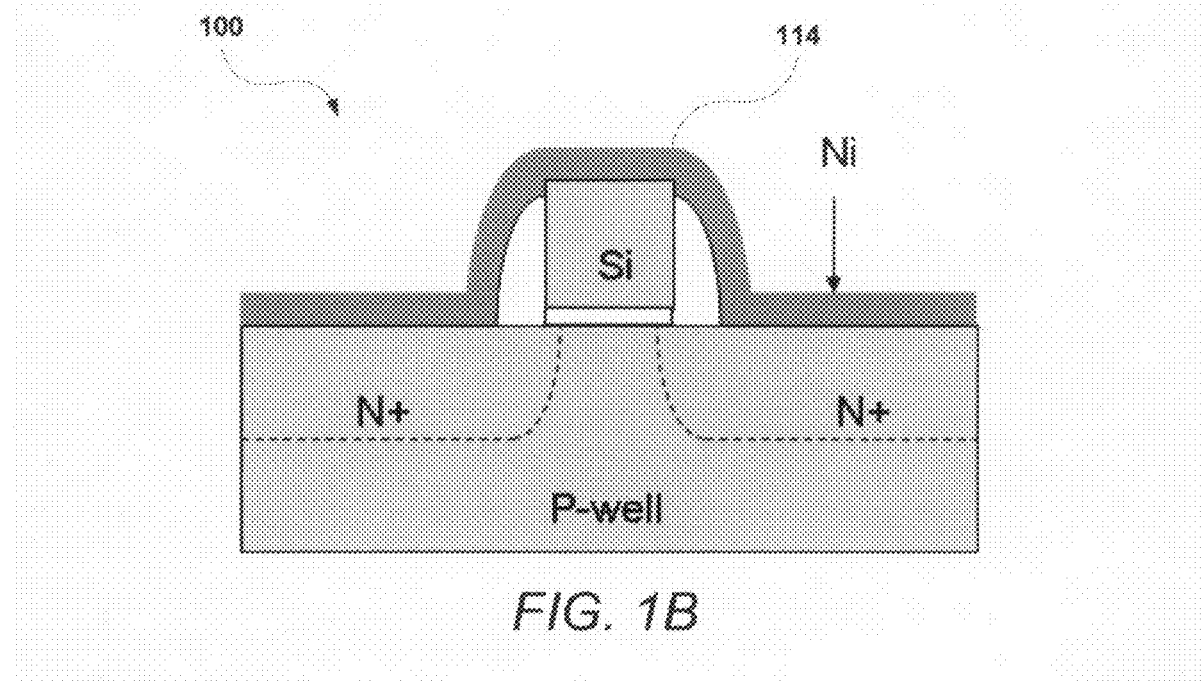
Figure 1C:
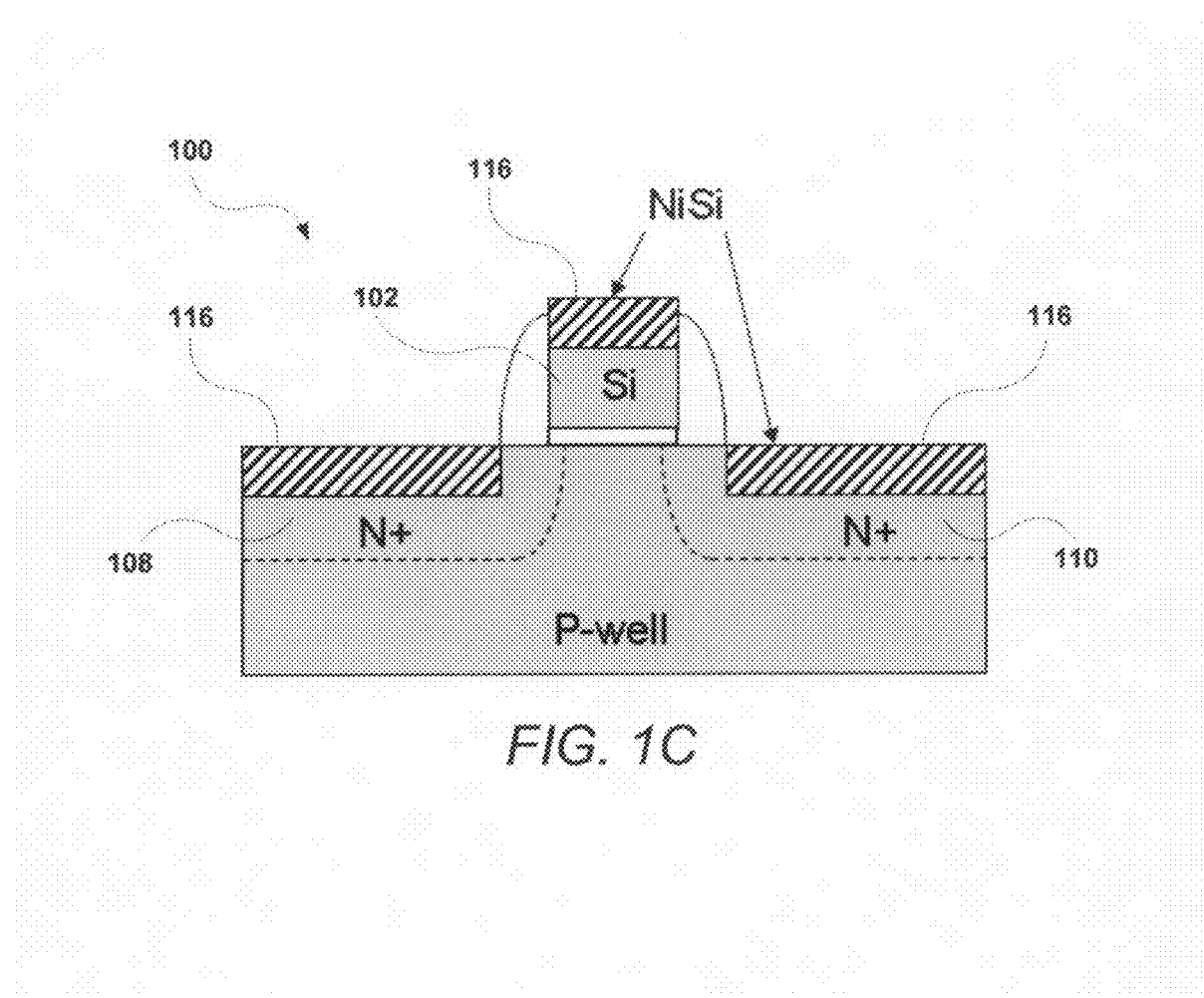

By way of background, FIGS. 1A to 1C illustrate how a conventional silicide layer is formed on a MOS transistor. FIG. 1 illustrates a MOS transistor 100 that includes a gate electrode 102, a gate oxide 104, pair of spacers 106, a source region 108, and a drain region 110. The transistor 100 is formed on a substrate 112, such as a semiconductor wafer. The semiconductor wafer may be formed of materials that include, but are not limited to, silicon, germanium, indium antimonide, lead telluride, indium arsenide, indium phosphide, gallium arsenide, or gallium antimonide.

The gate oxide 104 is disposed between the spacers 106 and may be formed from a dielectric such as silicon dioxide ($SiO_2$) or a high-k dielectric. High-k dielectric materials that may be used include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate electrode 102 may be formed by depositing and patterning a layer of polysilicon (for an $SiO_2$ gate dielectric) or a metal (for a high-k gate dielectric). The source region 108 and drain region 110 may include polysilicon and may be formed by implanting dopants into regions of the substrate surface 112 that are adjacent to the spacers 106. Dopants that may be used to form the source and drain regions 108/110 are well known in the art. Alternately, the source region 108 and drain region 110 may be grown using an epitaxial process.

FIG. 1B illustrates a nickel layer 114 that has been deposited upon the transistor 100. Conventional metal deposition processes, such as a sputtering deposition process, may be used to form the nickel layer 114. An annealing process may then be carried out to cause the nickel metal to react with certain active regions of the transistor 100 and form nickel silicide layers. Any unreacted nickel metal may be selectively removed using known processes.

FIG. 1C illustrates the result of the annealing process. Nickel silicide layers 116 are formed over active regions of the transistor 100, such as the source and drain regions 108/110. And if the gate electrode 102 is formed of polysilicon, a nickel silicide layer may be formed atop the gate electrode 102. The nickel silicide layers 116 reduce the electrical resistance between subsequently formed electrical contacts and the source and drain regions 108/110. But as described above, the nickel silicide layers 116 also contain an unacceptably high concentration of carbon.

Figure 2:
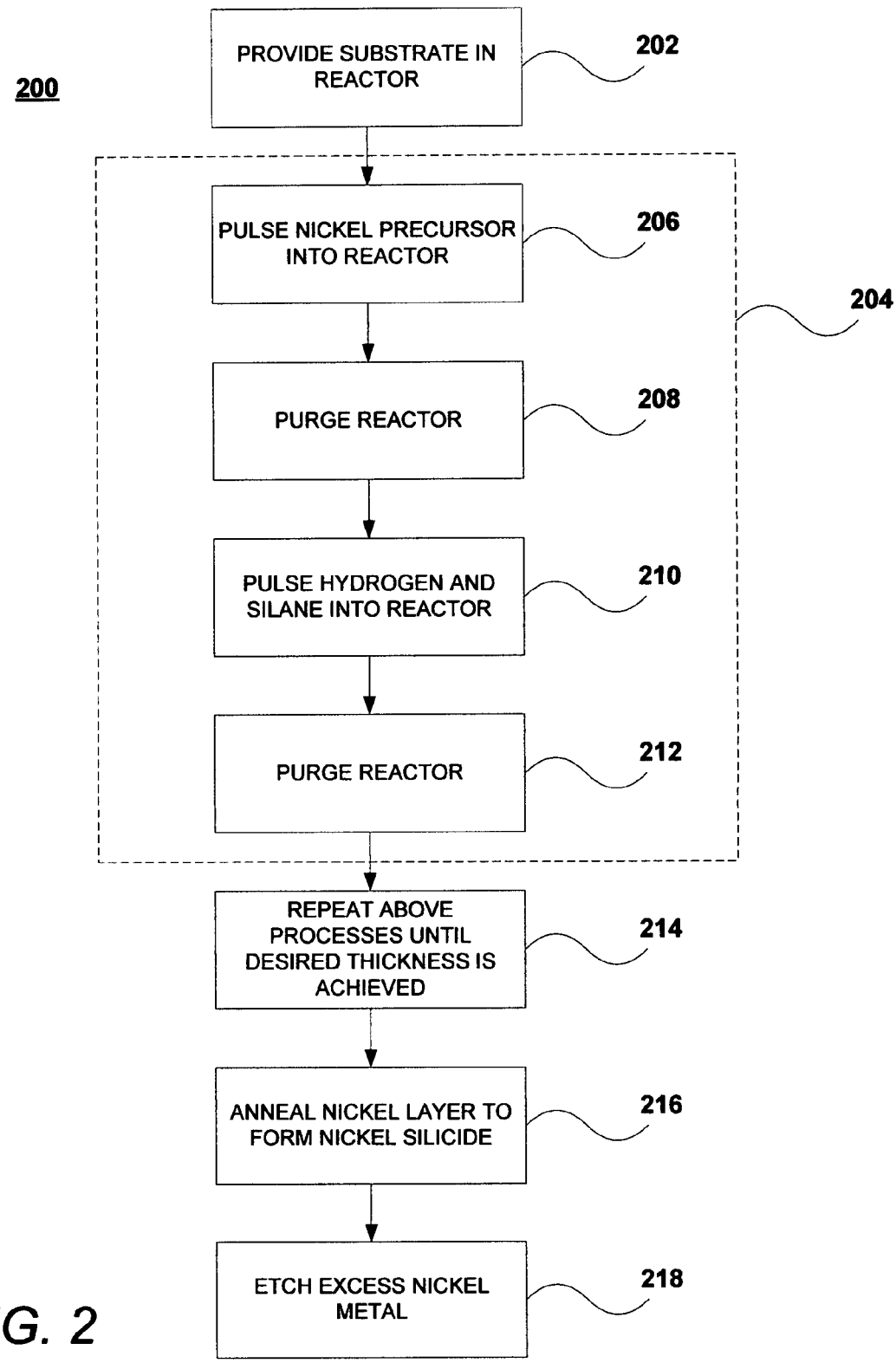
FIG. 2 is a method of forming such a silicide layer in accordance with an implementation of the invention.

Implementations of the invention provide processes by which nickel silicide layers may be formed that have a much lower carbon content relative to conventionally formed nickel silicide layers. FIG. 2 is one method 200 of forming such a silicide layer in accordance with an implementation of the invention. In this implementation, a nickel metal layer is first formed with low carbon incorporation from the outset. This nickel layer is then annealed with the polysilicon to form a nickel silicide layer.

The method 200 of FIG. 2 begins by providing a substrate housed in an atomic layer deposition (ALD) reactor (process 202 of FIG. 2). The substrate has at least one transistor formed on its surface having active regions that include polysilicon. The substrate may be heated within the reactor to a temperature between around 25° C. and around 450° C. and the pressure within the reactor may range from 0.01 Torr to 30.0 Torr.

One or more ALD process cycles are then used to deposit a nickel layer (204). This process cycle usually begins with the introduction of at least one pulse of a nickel precursor into the reactor (206). Nickel precursors that may be used in implementations of the invention described herein are provided below.

In various implementations of the invention, the following process parameters may be used for the nickel precursor pulse. The nickel precursor pulse may have a duration that ranges from around 0.05 seconds to around 90 seconds with a flow rate depending on hardware and process demands. The specific number of nickel precursor pulses will range depending on the desired thickness of the final nickel layer. The nickel precursor temperature may be between around 25° C. and 300° C. The vaporizer temperature may be around 25° C. to around 300° C.

A carrier gas may be employed to transport the nickel precursor, with a temperature that generally ranges from around 25° C. to around 300° C. Carrier gases that may be used here include, but are not limited to, argon (Ar), xenon (Xe), helium (He), hydrogen ($H_2$), nitrogen ($N_2$), forming gas, or mixture of these gases. The flow rate of the carrier will vary based on hardware designs and process demands.

Finally, an RF energy source may be applied at a power that ranges from 5 W to 2000 W and at a frequency of 13.56 MHz, 27 MHz, or 60 MHz. It should be noted that the scope of the invention includes any possible set of process parameters that may be used to carry out the implementations of the invention described herein.

After the at least one pulse of the nickel precursor, the reactor may be purged (208). The purge gas may be an inert gas such as Ar, Xe, $N_2$, He, or forming gas and the duration of the purge may range from 0.1 seconds to 60 seconds, depending on the ALD reactor configurations and other deposition conditions. In most implementations of the invention, the purge may range from 0.5 seconds to 10 seconds.

Next, in accordance with an implementation of the invention, a mixture of hydrogen and silane is pulsed into the reactor to react with the nickel precursor (210). The hydrogen may be provided in gaseous form or as a plasma. The hydrogen reacts with the nickel precursor to form a nickel layer while the silane acts as a getterer for the advantageous carbon in the nickel layer that is produced. The resultant nickel layer therefore has a low carbon content.

In implementations of the invention, the hydrogen and silane may both be in a gaseous form for this ALD pulse, and the silane concentration may range from around 1% to around 100%. The types of silane used may include, but are not limited to, silane, disilane, trisilane, tetrasilane, or branched silanes that follow the empirical formula $Si_xH_{2x+2}$. Alternately, a mixture of a gaseous silane and a hydrogen plasma may be used in lieu of gaseous hydrogen.

Conventional process parameters may be used for the hydrogen/silane mixture pulse. For instance, in implementations of the invention, the process parameters for this pulse include, but are not limited to, a pulse duration of between around 0.05 seconds and 90 seconds, a flow rate dependent on hardware and process concerns, a reactor pressure between around 0.05 Torr and 30.0 Torr, a temperature between around 25° C. and 300° C., a substrate temperature between around 25° C. and around 500° C., and an RF energy source that may be applied at a power that ranges from 5 W to 2000 W and at a frequency of 13.56 MHz, 27 MHz, or 60 MHz. The specific number of hydrogen/silane mixture pulses may range from 1 pulse to 200 pulses or more. It should be noted that the scope of the invention includes any possible set of process parameters that may be used to carry out the implementations of the invention described herein.

After the at least one pulse of the hydrogen/silane mixture, the reactor may again be purged (212). The purge gas may be an inert gas such as Ar, Xe, $N_2$, He, or forming gas and the duration of the purge may range from 0.1 seconds to 60 seconds, depending on the ALD reactor configurations and other deposition conditions. In most implementations of the invention, the purge may range from 0.5 seconds to 10 seconds.

The above processes result in the formation of a nickel layer on the active regions of the MOS transistor that has a low carbon content due to the getter functionality of the silane. If the nickel layer has not yet reached a desired thickness, the above processes may be repeated as necessary until the desired thickness is achieved (214).

As mentioned above, a hydrogen plasma may be used as a co-reactant. The hydrogen plasma may be employed as a co-reactant in addition to the gaseous hydrogen or in lieu of the gaseous hydrogen described above. If a hydrogen plasma is used as the co-reactant, process parameters that may be used include a flow rate of around 200 SCCM to around 600 SCCM, though the hydrogen plasma flow rate will heavily depend on hardware and process concerns. The hydrogen plasma may be pulsed into the reactor with a pulse duration of around 0.1 seconds to around 15.0 seconds, with a pulse duration of around 1 to 4 seconds often being used. The plasma power may range from around 5 W to around 2000 W and will generally range from around 60 W to around 200 W. A carrier gas such as He, Ar, or Xe may be used to introduce the plasma. A chuck upon which the semiconductor substrate is mounted may be biased and capacitively-coupled.

After the formation of the low carbon nickel layer, conventional processes may be used to form the silicide. For instance, the substrate may be heated or annealed to allow the nickel metal to react with exposed silicon in the active regions of the MOS device, such as the source and drain regions (216). The anneal results in a low-resistance nickel silicide. Following the reaction, any remaining nickel may be removed by chemical etching (218), restricting the silicide layers to only the active regions of the device.

In another implementation of the invention, a thin silicon-containing capping layer, such as a silicon dioxide capping layer, may be deposited upon the low carbon nickel layer formed in accordance with the method 200 of FIG. 2. The thin silicon capping layer may be used to draw carbon out of the nickel layer.

Figure 3:
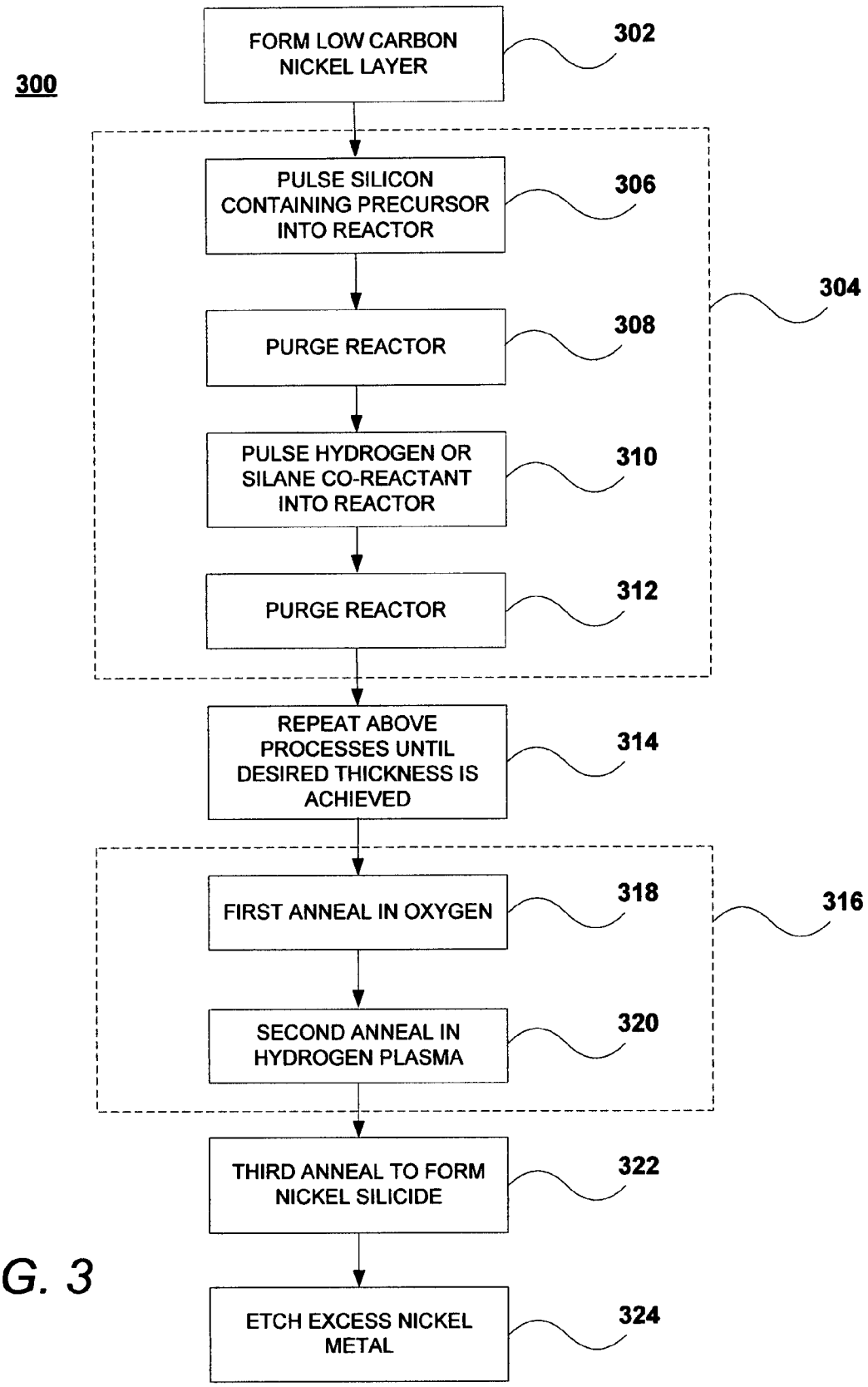
FIG. 3 illustrates such a method of the invention that utilizes a silicon capping layer.

FIG. 3 illustrates such a method 300 of the invention that utilizes a silicon capping layer. The method 300 begins by forming a low carbon nickel layer in accordance with the method 200 of FIG. 2 (302). For example, the low carbon nickel layer may be formed using processes 204 through 214 of method 200. As described above, the nickel layer is formed by an ALD process in which a nickel precursor is reacted with hydrogen and silane co-reactants.

Next, one or more ALD process cycles are used to form a silicon-containing layer atop the nickel layer (304). This ALD process cycle usually begins with the introduction of at least one pulse of a silicon-containing precursor into the reactor (306). Silicon-containing precursors that may be used in implementations of the invention include, but are not limited to, substituted silanes, amino silanes, cyclic amino-silanes, and cyclic-azido silanes. Examples of specific silicon-containing precursors that may be used in implementations of the invention are provided below.

In various implementations of the invention, the following process parameters may be used for the silicon-containing precursor pulse. The silicon-containing precursor pulse may have a duration that ranges from around 0.05 seconds to around 90 seconds with a flow rate dependent on hardware and process concerns. The specific number of silicon-containing precursor pulses may range from 1 pulse to 200 pulses or more depending on the desired thickness of the final silicon layer. The silicon-containing precursor temperature may be between around 25° C. and 250° C. The vaporizer temperature may be around 25° C. to around 250° C.

A carrier gas may be employed to move the silicon-containing precursor, with a temperature that generally ranges from around 25° C. to around 250° C. Carrier gases that may be used here include, but are not limited to, Ar, Xe, He, $H_2$, $N_2$, forming gas, or mixture of these gases. The flow rate of the carrier gas will depend on hardware and process concerns.

Finally, an RF energy source may be applied at a power that ranges from 5 W to 2000 W and at a frequency of 13.56 MHz, 27 MHz, or 60 MHz. It should be noted that the scope of the invention includes any possible set of process parameters that may be used to carry out the implementations of the invention described herein.

After the at least one pulse of the silicon-containing precursor, the reactor may be purged (308). The purge gas may be an inert gas such as Ar, Xe, $N_2$, He, or forming gas and the duration of the purge may range from 0.1 seconds to 120 seconds, depending on the ALD reactor configurations and other deposition conditions. In most implementations of the invention, the purge may range from 0.5 seconds to 10 seconds.

Next, in accordance with an implementation of the invention, a hydrogen or silane based co-reactant is pulsed into the reactor to react with the silicon-containing precursor surface (310). The hydrogen or silane co-reactant reacts with the silicon-containing precursor to form a silicon-containing capping layer over the nickel layer.

Conventional process parameters may be used for the hydrogen or silane co-reactant pulse. For instance, in implementations of the invention, the process parameters for this pulse include, but are not limited to, a pulse duration of between around 0.05 seconds and 90 seconds, a flow rate dependent on hardware and process concerns, a reactor pressure between around 0.05 Torr and 30.0 Torr, a temperature between around 25° C. and 300° C., a substrate temperature between around 25° C. and around 400° C., and an RF energy source that may be applied at a power that ranges from 5 W to 2000 W and at a frequency of 13.56 MHz, 27 MHz, or 60 MHz. The specific number of hydrogen or silane co-reactant pulses will vary based on hardware and process. It should be noted that the scope of the invention includes any possible set of process parameters that may be used to carry out the implementations of the invention described herein.

After the at least one pulse of the hydrogen or silane based co-reactant, the reactor may again be purged (312). The purge gas may be an inert gas such as Ar, Xe, $N_2$, He, or forming gas and the duration of the purge may range from 0.1 seconds to 60 seconds, depending on the ALD reactor configurations and other deposition conditions. In most implementations of the invention, the purge may range from 0.5 seconds to 10 seconds.

The above processes result in the formation of silicon-containing capping layers atop the nickel layers that were formed on the active regions of the MOS transistor. If the silicon-containing capping layers have not yet reached a desired thickness, the above processes may be repeated as necessary until the desired thickness is achieved (314).

In further implementations, a plasma may be used as a co-reactant for the silicon-containing precursor. For instance, a hydrogen plasma may be employed as a co-reactant. If a hydrogen plasma is used as the co-reactant, process parameters that may be used include a flow rate of around 200 SCCM to around 600 SCCM, though the hydrogen plasma flow rate will heavily depend on hardware and process concerns. The hydrogen plasma may be pulsed into the reactor with a pulse duration of around 0.1 seconds to around 15.0 seconds, with a pulse duration of around 1 to 4 seconds often being used. The plasma power may range from around 5 W to around 2000 W and will generally range from around 60 W to around 200 W. A carrier gas such as He, Ar, or Xe may be used to introduce the plasma. A chuck upon which the semiconductor substrate is mounted may be biased and capacitively-coupled.

In accordance with implementations of the invention, the silicon-containing layer may now be used to draw carbon out of the nickel layer. This may be accomplished by subjecting the silicon-containing layer and the nickel layer to sequential annealing processes (316). The first annealing process is a low-temperature annealing process in the presence of oxygen (318). This oxidizing anneal drives off the carbon incorporated in the layers through gettering of the carbon and release of carbon dioxide. The second annealing process is a low-temperature annealing process in the presence of a hydrogen plasma (320). This second annealing process in the presence of hydrogen drives off the remaining oxygen.

The resulting nickel layer may then be annealed to form a nickel silicide layer using conventional processes. For instance, the substrate may be heated or annealed to allow the nickel metal to react with exposed silicon in the active regions of the MOS device, such as the source and drain regions (322). The anneal results in a low-resistance nickel silicide. Following the reaction, any remaining nickel may be removed by chemical etching (324), restricting the silicide layers to only the active regions of the device.

In yet another implementation of the invention, a nickel layer with a low carbon content may be generated by forming a nickel oxide layer and then reducing the oxide layer to form a nickel metal layer. For instance, an ALD process may be used in which one of the nickel precursors disclosed below is reacted with an oxidizing agent such as oxygen or $N_2O$. The nickel layer that is formed may then be subjected to a low-temperature anneal with a hydrogen plasma to drive off the remaining oxygen. The resulting nickel metal layer may subsequently be annealed to form a nickel silicide layer.

In accordance with implementations of the invention, the nickel (Ni) precursor used in any of the implementations disclosed above may be one or more of the following nickel precursors: bis(cyclopentadienyl)Ni, bis(alkylcyclopentadienyl)Ni (where the alkyl group can be methyl, ethyl, sec-butyl, isopropyl or other and need not be the same alkyl group on both cyclopentadienyl rings), nickel carbonyl, allyl(cyclopentadienyl)Ni, allyl(alkylcyclopentadienyl)Ni (where the alkyl groups may be the same as previously listed), bis(bis-trimethylsilylamino)Ni, and bis(acetylacetonate)Ni. In some implementations of the invention, the above listed precursors may be modified by mixing of the ratio of ligands or substituting analogues of ligands. In other implementations, more than one of the nickel precursors, each having different ligands, may be used simultaneously in the ALD process.

In accordance with implementations of the invention, the silane precursor used in any of the implementations disclosed above may be one or more of the following silane precursors: 1,2,4,5-tetraaza-3,6-disilacyclohexane, halogenated 1,2,4,5-tetraaza-3,6-disilacyclohexane, amine substituted 1,2,4,5-tetraaza-3,6-disilacyclohexane, aryl substituted 1,2,4,5-tetraaza-3,6-disilacyclohexane, alkyl substituted 1,2,4,5-tetraaza-3,6-disilacyclohexane, silyl hydrazines, aminosilane with diamene ligands, halogenated amino silane, linear silazanes, cyclic azasilane, silyl methane, general alkyl silane, methyldisilane, generic alkyl disilane, generic alkyl trisilane, simple aminosilane, and hydrazine substituted silane. In some implementations of the invention, the above listed precursors may be modified by mixing of the ratio of ligands or substituting analogues of ligands. In other implementations, more than one of the silane precursors, each having different ligands, may be used simultaneously in the ALD process.

Accordingly, methods have been disclosed for forming a nickel layer with a low carbon content using an ALD process. Such nickel layers provide low resistance metal films that are ideal for silicide formation. The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   providing a semiconductor substrate within a reactor;
   performing a first ALD process cycle to form a nickel layer on the substrate, wherein the first ALD process cycle comprises:
      pulsing a nickel precursor into the reactor,
      purging the reactor after the nickel precursor,
      pulsing a mixture of hydrogen and silane into the reactor, and
      purging the reactor after the hydrogen and silane pulse;
   performing a second ALD process cycle to form a silicon-containing capping layer on the nickel layer, wherein the second ALD process cycle comprises:
      pulsing a silane precursor into the reactor,
      purging the reactor after the silane precursor,
      pulsing a co-reactant into the reactor, and
      purging the reactor after the co-reactant pulse;
   performing a first anneal in the presence of oxygen to getter carbon from at least one of the nickel layer and the silicon-containing layer;
   performing a second anneal in the presence of a hydrogen plasma to drive off oxygen; and
   performing a third anneal of the nickel layer to form a nickel silicide layer.

2. The method of claim 1, further comprising repeating the first ALD process cycle until the nickel layer reaches a desired thickness.

3. The method of claim 1, further comprising repeating the second ALD process cycle until the silicon-containing layer reaches a desired thickness.

4. The method of claim 1, wherein at least a portion of the hydrogen comprises a hydrogen plasma.

5. The method of claim 1, wherein the nickel precursor is chosen from the group consisting of bis(cyclopentadienyl)Ni, bis(alkylcyclopentadienyl)Ni (where the alkyl group can be methyl, ethyl, sec-butyl, isopropyl or other and need not be the same alkyl group on both cyclopentadienyl rings), nickel carbonyl, allyl(cyclopentadienyl)Ni, allyl(alkylcyclopentadienyl)Ni (where the alkyl groups may be the same as previously listed), bis(bis-trimethylsilylamino)Ni, and bis(acetylacetonate)Ni.

6. The method of claim 1, wherein the silane comprises silane, disilane, trisilane, tetrasilane, or a branched silane that follows the empirical formula $Si_xH_{2x+2}$.

7. The method of claim 1, wherein the silane precursor is chosen from the group consisting of 1,2,4,5-tetraaza-3,6-disilacyclohexane, halogenated 1,2,4,5-tetraaza-3,6-disilacyclohexane, amine substituted 1,2,4,5-tetraaza-3,6-disilacyclohexane, aryl substituted 1,2,4,5-tetraaza-3,6-disilacyclohexane, alkyl substituted 1,2,4,5-tetraaza-3,6-disilacyclohexane, silyl hydrazines, aminosilane with diamene ligands, halogenated amino silane, linear silazanes, cyclic azasilane, silyl methane, general alkyl silane, methyldisilane, generic alkyl disilane, generic alkyl trisilane, simple aminosilane, and hydrazine substituted silane.

8. The method of claim 1, wherein the co-reactant comprises a hydrogen based co-reactant or a silane-based co-reactant.

* * * * *